United States Patent
Chen et al.

(10) Patent No.: US 12,066,468 B1
(45) Date of Patent: Aug. 20, 2024

(54) METHOD AND DEVICE FOR DETECTING SYSTEM FAILURE, COMPUTER DEVICE, AND STORAGE MEDIUM

(71) Applicant: China Electronic Product Reliability and Environmental Testing Research Institute (The Fifth Electronic Research Institute of Ministry of Industry and Information Technology) (CEPREI)), Guangzhou (CN)

(72) Inventors: Yiqiang Chen, Guangzhou (CN); Bo Hou, Guangzhou (CN); Yihang Lin, Guangzhou (CN); Dazhi Wang, Guangzhou (CN); Shuo Zhang, Guangzhou (CN); Haipin Wu, Guangzhou (CN)

(73) Assignee: CHINA ELECTRONIC PRODUCT RELIABILITY AND ENVIRONMENTAL TESTING RESEARCH INSTITUTE ((THE FIFTH ELECTRONIC RESEARCH INSTITUTE OF MINISTRY OF INDUSTRY ANBD INFORMATION TECHNOLOGY (CEPREI)) (CN)

( * ) Notice: Subject to any disclaimer, the term of this patent is extended or adjusted under 35 U.S.C. 154(b) by 0 days.

(21) Appl. No.: 18/434,104

(22) Filed: Feb. 6, 2024

(30) Foreign Application Priority Data

Feb. 23, 2023 (CN) .......................... 202310163156.0

(51) Int. Cl.
*G01R 19/165* (2006.01)
*G01R 27/26* (2006.01)
(Continued)

(52) U.S. Cl.
CPC ....... *G01R 19/16533* (2013.01); *G01R 27/26* (2013.01); *G01R 27/28* (2013.01); *G01R 31/16* (2013.01); *G01R 31/40* (2013.01)

(58) Field of Classification Search
CPC .. G01R 19/16533; G01R 31/40; G01R 27/26; G01R 27/28; G01R 31/016
See application file for complete search history.

(56) References Cited

U.S. PATENT DOCUMENTS

2005/0134394 A1 * 6/2005 Liu .................. G01R 31/31727
331/57
2012/0116696 A1 5/2012 Wank
(Continued)

FOREIGN PATENT DOCUMENTS

| CN | 101387668 A | 3/2009 |
| CN | 109655691 A | 4/2019 |

(Continued)

OTHER PUBLICATIONS

International Search Report and Written Opinion issued for PCT/CN2023/088644 on Feb. 23, 2023 (8 pages).

*Primary Examiner* — Scott Bauer
(74) *Attorney, Agent, or Firm* — Polsinelli PC

(57) ABSTRACT

Disclosed are a method and device for detecting system failure, a computer device, and a storage medium. The method includes obtaining, when a system to be detected is powered on or off, a real-time voltage oscillation signal acquired by a voltage sensor arranged in a detection circuits of the system. The detection circuit is a circuit where a source and drain of a switching device in the system are located. A degradation trend of the system is determined according to the real-time voltage oscillation signal and a reference voltage oscillation signal corresponding to the detection circuit of the system. A failure detection for the (Continued)

system is performed according to the degradation trend of the system.

20 Claims, 6 Drawing Sheets

(51) Int. Cl.
*G01R 27/28* (2006.01)
*G01R 31/16* (2006.01)
*G01R 31/40* (2020.01)

(56) References Cited

U.S. PATENT DOCUMENTS

| | | | |
|---|---|---|---|
| 2012/0299477 A1* | 11/2012 | Kambara | H05B 45/50 |
| | | | 315/201 |
| 2013/0057297 A1* | 3/2013 | Cheng | H02M 7/539 |
| | | | 324/548 |
| 2015/0355259 A1* | 12/2015 | Sartler | H02M 1/126 |
| | | | 324/548 |
| 2016/0006347 A1* | 1/2016 | Matsui | H02M 3/155 |
| | | | 323/304 |

FOREIGN PATENT DOCUMENTS

| | | |
|---|---|---|
| CN | 110175388 A | 8/2019 |
| CN | 111258303 A | 6/2020 |
| CN | 114325461 A | 4/2022 |
| CN | 115420971 A | 12/2022 |
| KR | 2021-0028312 A | 3/2021 |

* cited by examiner

METHOD AND DEVICE FOR DETECTING SYSTEM FAILURE, COMPUTER DEVICE, AND STORAGE MEDIUM

CROSS-REFERENCE TO RELATED APPLICATIONS

The present application claims priority to Chinese patent application No. 2023101631560 filed with the Chinese Patent Office on Feb. 23, 2023, entitled "METHOD AND DEVICE FOR DETECTING SYSTEM FAILURE, COMPUTER DEVICE, AND STORAGE MEDIUM", which is hereby incorporated by reference in its entirety.

TECHNICAL FIELD

The present disclosure relates to the field of electric power technology, and particularly to a method and device for detecting system failure, a computer device, and a storage medium.

BACKGROUND

With the continuous development of microelectronics technology and the continuous improvement of informatization, intelligence, and electrification of modern equipments, the performance degradation of electronic components will seriously affect the operation of various modern systems, thereby affecting normal production and life. Therefore, it is very important to perceive the failures of these systems.

SUMMARY

In a first aspect, the present disclosure provides a method for detecting system failure. The method includes: obtaining, when a system to be detected is powered on or off, a real-time voltage oscillation signal acquired by a voltage sensor arranged in a detection circuit of the system, the detection circuit being a circuit where a source and drain of a switching device of the system are located; determining a degradation trend of the system according to the real-time voltage oscillation signal and a reference voltage oscillation signal corresponding to the detection circuit of the system; and performing a failure detection on the system according to the degradation trend of the system.

In some embodiments, the determining the degradation trend of the system according to the real-time voltage oscillation signal and the reference voltage oscillation signal corresponding to the detection circuit of the system includes: determining a real-time oscillation frequency according to the real-time voltage oscillation signal; determining a reference oscillation frequency according to the reference voltage oscillation signal corresponding to the detection circuit of the system; and determining the degradation trend of the system according to the real-time oscillation frequency and the reference oscillation frequency.

In some embodiments, the determining the real-time oscillation frequency according to the real-time voltage oscillation signal includes determining a voltage oscillation period according to the real-time voltage oscillation signal, and determining the real-time oscillation frequency according to the voltage oscillation period.

In some embodiments, the determining the degradation trend of the system according to the real-time oscillation frequency and the reference oscillation frequency includes: determining the degradation trend of the system according to a ratio of the real-time oscillation frequency to the reference oscillation frequency.

In some embodiments, the voltage sensor has a capacitive coupling structure. The voltage sensor includes an upper insulating plate, a lower insulating plate, a coupling structure impedance, and a voltage output port. The upper insulating plate is configured for a placement of an energized wire of the detection circuit. The lower insulating plate is configured for a placement of a metal sheet that senses the real-time voltage oscillation signal of the energized wire. One end of the coupling structure impedance is connected to the metal sheet, and the other end of the coupling structure impedance is connected to the voltage output port. The real-time voltage oscillation signal sensed by the metal sheet is transmitted to the voltage output port through the coupling structure impedance.

In some embodiments, a relationship mapping table is created based on a relationship between various voltage oscillation signals, the reference voltage oscillation signal, and the degradation trend of the system. The degradation trend of the system is determined by looking up the relationship mapping table.

In some embodiments, a fault threshold is pre-set. It is determined that a failure is about to occur in the system when it is detected that the degradation degree of the system is about to exceed the fault threshold.

In some embodiments, the system includes a DC-to-AC inverter and/or a DC-to-DC power supply circuit.

In a second aspect, the present disclosure also provides a device for detecting a system fault. The device includes a signal obtaining module, a trend determining module, and a failure detecting module.

The signal obtaining module is configured to obtain, when a system to be detected is powered on or off, a real-time voltage oscillation signal acquired by a voltage sensor arranged in a detection circuit of the system. The detection circuit is a circuit where a source and drain of a switching device in the system are located.

The trend determining module is configured to determine a degradation trend of the system according to the real-time voltage oscillation signal and a reference voltage oscillation signal corresponding to the detection circuit of the system.

The failure detecting module is configured to perform a failure detection on the system according to the degradation trend of the system.

In a third aspect, the present disclosure also provides a computer device, which includes a memory and a processor. The memory stores a computer program. The processor, when executing the computer program, performs the following steps: obtaining, when a system to be detected is powered on or off, a real-time voltage oscillation signal acquired by a voltage sensor arranged in a detection circuit of the system, the detection circuit being a circuit where a source and drain of a switching device of the system are located; determining a degradation trend of the system according to the real-time voltage oscillation signal and a reference voltage oscillation signal corresponding to the detection circuit of the system; and performing a failure detection on the system according to the degradation trend of the system.

In a fourth aspect, the present disclosure also provides a non-transitory computer-readable storage medium, in which a computer program is stored. The computer program, when executed by a processor, cause the processor to perform the following steps: obtaining, when a system to be detected is powered on or off, a real-time voltage oscillation signal acquired by a voltage sensor arranged in a detection circuit of the system, the detection circuit being a circuit where a source and drain of a switching device of the system are located; determining a degradation trend of the system according to the real-time voltage oscillation signal and a reference voltage oscillation signal corresponding to the detection circuit of the system; and performing a failure detection on the system according to the degradation trend of the system.

In a fifth aspect, the present disclosure also provides a computer program product, which includes a computer program that, when executed by a processor, causes the processor to perform the following steps: obtaining, when a system to be detected is powered on or off, a real-time voltage oscillation signal acquired by a voltage sensor arranged in a detection circuit of the system, the detection circuit being a circuit where a source and drain of a switching device of the system are located; determining a degradation trend of the system according to the real-time voltage oscillation signal and a reference voltage oscillation signal corresponding to the detection circuit of the system; and performing a failure detection on the system according to the degradation trend of the system.

DETAILED DESCRIPTION OF THE EMBODIMENTS

In order to make the purpose, technical solutions and advantages of the present disclosure clearer, the present disclosure will be described in detail with reference to the accompanying drawings and embodiments. It should be understood that the specific embodiments described herein are merely intended to explain the present disclosure and are not intended to limit the present disclosure.

As known to the applicant, in various conventional failure detection methods, current signals, voltage signals, etc. of electronic components in the equipment system are typically monitored online using sensors such as current transformers, Rogowski coils, Hall sensors, etc., thereby obtaining failure information of circuits, modules, or the system. Such methods can only detect obvious system failures and can only detect the failures after they have occurred in the system to be detected, rather than detecting the degradation process of the system in real time or predicting the system failures. Therefore, detecting the degradation process of the system in real time and predicting failures has become an urgent problem to be solved.

Figure 1:
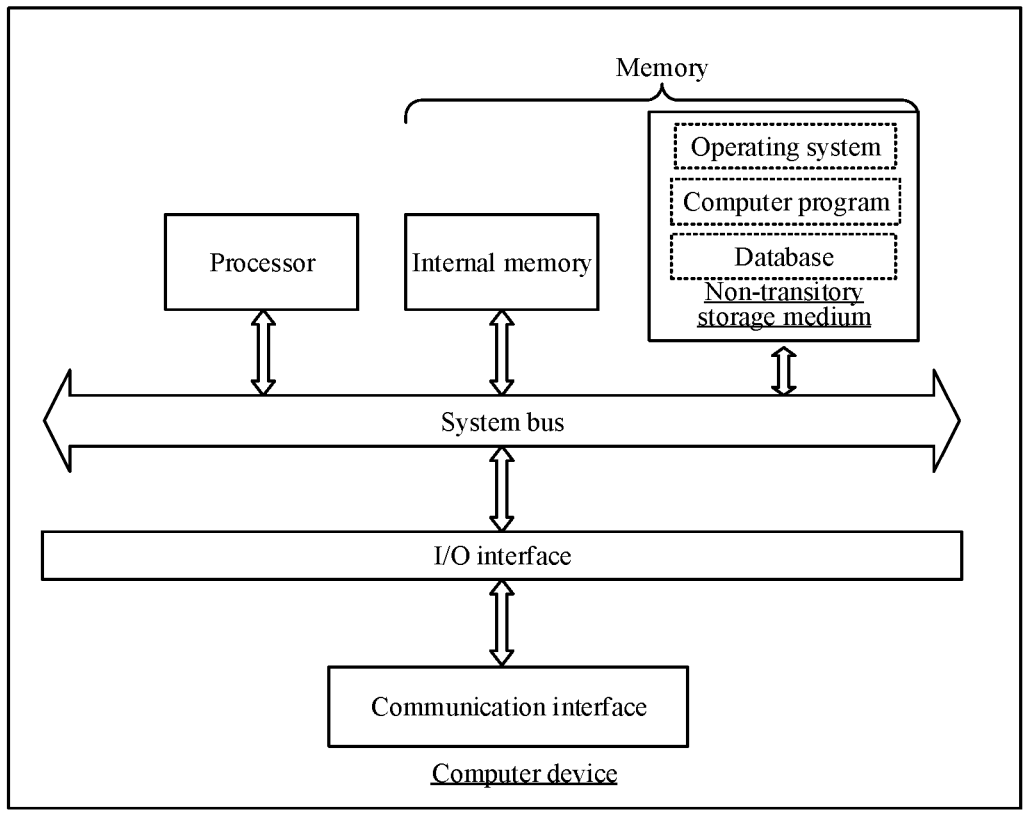
FIG. 1 shows an application environment of a method for detecting system failure according to an embodiment.

The method for detecting system failure provided in the embodiments of the present disclosure can be applied in an application environment as shown in FIG. 1. In an embodiment, the application environment includes a computer device, which may be a server, with its internal structure illustrated in FIG. 1. The computer device includes a processor, a memory, and a network interface connected via a system bus. The processor of the computer device provides computing and control capabilities. The memory of the computer device includes a non-transitory storage medium and an internal memory. The non-transitory storage medium stores the operating system, computer programs, and databases. The internal memory provides an environment for running the operating systems and computer programs stored in the non-transitory storage medium. The database of the computer device is used to store data required for related processing. The network interface of the computer device is used to communicate with external terminals through a network connection. When the computer programs are executed by the processor, the method for detecting system failure shown in any of the following embodiments is implemented.

Figure 2:
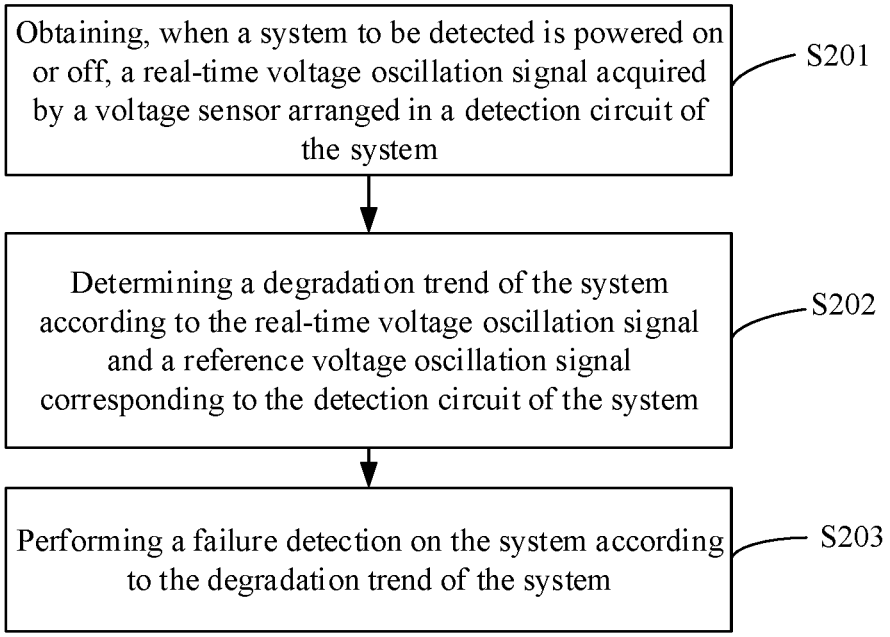
FIG. 2 is a schematic flowchart of a method for detecting system failure according to an embodiment.

In an embodiment, as shown in FIG. 2, a method for detecting system failure is provided. Taking the implementation with the computer device as shown in FIG. 1 as an example, the method includes the following steps S201-S203.

In step S201, a real-time voltage oscillation signal acquired by a voltage sensor arranged in a detection circuit of a system to be detected is obtained when the system is powered on or off.

The detection circuit is the circuit where the source and drain of a switching device of the system are located. The system includes a DC-to-AC inverter and/or a DC-to-DC power supply circuit.

"When the system to be detected is powered on or off" refers to the moment when the circuit being detected is powered on or off. The voltage oscillation signal is the voltage signal formed by the voltage oscillation at the moment when the detection circuit of the system is powered on or powered off. The switching device of the system includes a gate, a drain and a source. The drain and the source are in the same loop, which is the detection circuit of the system.

In some embodiments, the voltage sensor is arranged above or below the detection circuit of the system. When the switch of the system is turned on or off, the detection circuit is powered on or off accordingly. At this time, the voltage of the detection circuit oscillates. The voltage sensor arranged above or below the detection circuit of the system can detect the oscillation and acquire the oscillation signal as the real-time voltage oscillation signal.

In some embodiments, the voltage sensor that acquires the real-time voltage oscillation signal is designed based on a capacitive coupling structure. The voltage sensor with the capacitive coupling structure can detect failures in the system without contacting the detection circuit of the system. Compared to the conventional contact-based method, in the method of the present solution, the original circuit of the system does not need to be changed, which makes the detection more accurate. In addition, the voltage sensor is arranged above or below the detection circuit of the system, making it more convenient to use.

In step S202, a degradation trend of the system is determined according to the real-time voltage oscillation signal and a reference voltage oscillation signal corresponding to the detection circuit of the system.

The reference voltage oscillation signal is the voltage oscillation signal when the system is in the initial state or the factory state. The reference voltage oscillation signal can be obtained by the voltage sensor arranged in the detection circuit of the system when the system is first put into use (i.e., the first power on and off operation), or it can be pre-marked at the time of production of the system. The real-time voltage oscillation signal is the voltage oscillation signal acquired by the voltage sensor when the system is in use. The degradation trend represents the degradation degree of the components in the system.

In some embodiments, a relationship mapping table can be created in advance based on the relationship between various voltage oscillation signals, the reference voltage oscillation signal, and the degradation trend of the system to be detected. After the real-time voltage oscillation signal and the reference voltage oscillation signal are determined, the degradation trend of the system can be determined by looking up the table.

In step S203, a failure detection is performed on the system according to the degradation trend of the system.

In some embodiments, a fault threshold may be pre-set. For example, the fault threshold is set to 30%. It is determined that a failure is about to occur in the system when it is detected that the degradation degree of the system is about to exceed the fault threshold, thereby realizing the failure detection of the system.

According to the above embodiment, the voltage sensor is employed to acquire the real-time voltage oscillation signal when the system is powered on or off. The real-time voltage oscillation signal is compared with the reference voltage oscillation signal corresponding to the detection circuit of the system. The degradation trend of the system is determined based on the comparison result of the two oscillation signals. Then, the system failure is predicted based on the degradation trend of the system. In this method, a voltage sensor is introduced. Every time the system being detected is powered on and off, the degradation trend of the system is reflected by the real-time voltage oscillation signal of the detection circuit and the reference voltage oscillation signal. By analyzing the degradation trend, the impending failure of the system can be predicted before the system fails, thereby achieving the prediction of system failures. In addition, even if there is a slight degradation of the system, the degradation trend of the system can be reflected through the slight difference between the real-time voltage oscillation signal and the reference voltage oscillation signal, thus realizing the real-time detection of minor failures. In other words, this solution can not only detect minor failures but also predict the system failures.

Figure 3:
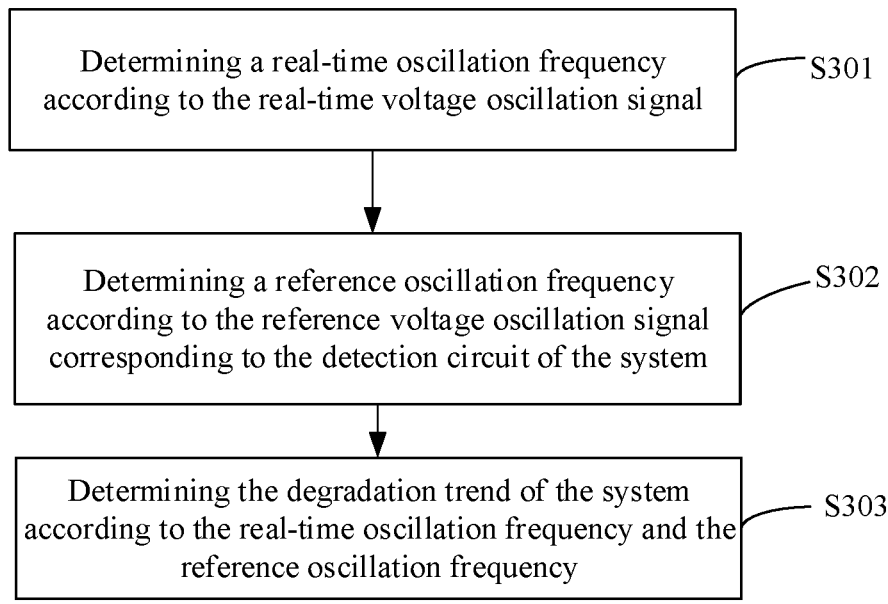
FIG. 3 is a schematic flowchart of a method for determining a degradation trend of a to-be-detected system according to an embodiment.

The above embodiment provides an overview of how to detect minor system failures and predict system failures. In this embodiment, as shown in FIG. 3, a more detailed description of how to determine the degradation trend of the system is provided, which includes the following steps S301-S303.

In step S301, a real-time oscillation frequency is determined according to the real-time voltage oscillation signal.

Specifically, a voltage oscillation period is first determined according to the real-time voltage oscillation signal, and then the real-time oscillation frequency is determined according to the voltage oscillation period.

The oscillation frequency refers to the number of voltage oscillations per second. The voltage oscillation period refers to the duration of each voltage oscillation.

In some embodiments, the voltage sensor is connected to an oscilloscope. After the voltage sensor transmits the real-time voltage oscillation signal to the oscilloscope, the oscilloscope displays the real-time voltage oscillation signal in the form of two-dimensional image coordinates. Then, the oscillation duration and the number of oscillations of the real-time voltage oscillation signal are determined by analyzing the coordinates. The duration of each oscillation, i.e., the voltage oscillation period, is obtained by dividing the oscillation duration by the number of oscillations. The reciprocal of the voltage oscillation period is the real-time oscillation frequency.

In step S302, a reference oscillation frequency is determined according to the reference voltage oscillation signal corresponding to the detection circuit of the system.

In some embodiments, the method of determining the reference oscillation frequency according to the reference voltage oscillation signal corresponding to the detection circuit of the system is similar to the method of determining the real-time oscillation frequency according to the real-time voltage oscillation signal in step S301 and will not be repeated herein.

In some embodiments, the reference oscillation frequency of the system may also be obtained directly by searching the nameplate of the system.

In step S303, the degradation trend of the system is determined according to the real-time oscillation frequency and the reference oscillation frequency.

Specifically, the degradation trend of the system is determined according to a ratio of the real-time oscillation frequency to the reference oscillation frequency.

The ratio of the real-time oscillation frequency to the reference oscillation frequency is related to the degradation degree of the system. The higher the degradation degree of the system, the smaller the ratio, i.e., the ratio of the real-time oscillation frequency to the reference oscillation frequency becomes smaller and smaller over time, and the real-time oscillation frequency is less than or equal to the reference oscillation frequency.

In some embodiments, the real-time oscillation frequency is divided by the reference oscillation frequency to obtain a number that is less than or equal to 1 and greater than or equal to 0. The closer the number is to 0, the more serious the degradation of the system is. The closer the number is to 1, the more slight the degradation of the system is.

It should be noted that the degradation of the system is essentially the changes in the equivalent inductance, equivalent capacitance, equivalent resistance, etc. in the circuit caused by the degradation of the components in the system. The changes in the equivalent inductance, equivalent capacitance and equivalent resistance, etc. will cause changes in the natural oscillation frequency (i.e., the real-time oscillation frequency) during transient switching of the circuit. Specifically, the more serious the degradation of the components, the lower the natural oscillation frequency during transient switching. Therefore, the degradation trend of the system can be determined according to the natural oscillation frequency of the circuit during transient switching. The relationship between the natural oscillation frequency and the equivalent inductance, equivalent capacitance, and equivalent resistance is specifically represented by the following formula (1):

$$F=(1/LC-R^2/4L^2)^{1/2}$$

where F is the natural oscillation frequency, L is the equivalent inductance, C is the equivalent capacitance, and R is the equivalent resistance.

In the above embodiment, the real-time oscillation frequency is first determined according to the real-time voltage oscillation signal, and then the reference oscillation frequency is determined according to the reference voltage oscillation signal. Finally, the degradation trend of the system is determined according to the ratio of the real-time oscillation frequency to the reference oscillation frequency. With this method, the real-time oscillation frequency changes even if there is a slight degradation of the system, and thus the degradation trend of the system is obtained. Therefore, with this method, slight system failures can be detected and system failures can be predicted according to system degradation.

The two embodiments described above illustrate the principle of detecting slight system degradation and predicting failures, with the voltage sensor being the key component. In this embodiment, as shown in FIG. 4, the structure of the voltage sensor will be described in detail.

The voltage sensor in this embodiment has a capacitive coupling structure. The voltage sensor includes an upper insulating plate, a lower insulating plate, a coupling structure impedance, and a voltage output port. The upper insulating plate is configured for the placement of an energized wire of the detection circuit. The lower insulating plate is configured for the placement of a metal sheet that senses the real-time voltage oscillation signal of the energized wire. One end of the coupling structure impedance is connected to the metal sheet, and the other end of the coupling structure impedance is connected to the voltage output port. The real-time voltage oscillation signal sensed by the metal sheet is transmitted to the voltage output port through the coupling structure impedance.

Figure 4:
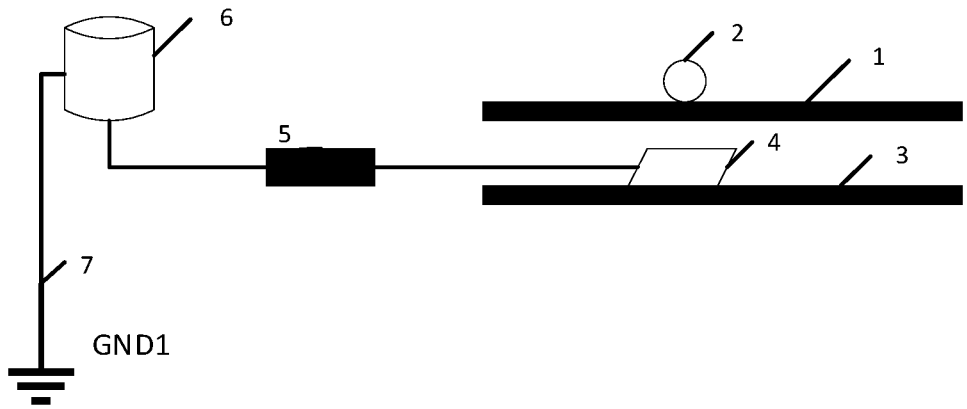
FIG. 4 is a schematic structural diagram of a voltage sensor according to an embodiment.

In some embodiments, as shown in FIG. 4, the voltage sensor includes an upper insulating plate 1 configured for the placement of an energized wire 2 of the detection circuit, a lower insulating plate 3 configured for the placement of a metal sheet 4 that senses the real-time voltage oscillation signal of the energized wire 2, and a coupling structure impedance 5 with a fixed value. For example, in this embodiment, the resistance value of the coupling structure impedance may be 50 ohms. A voltage output port 6 is configured to transmit the real-time voltage oscillation signal to the outside. For example, when the voltage output port 6 is connected to an oscilloscope, the voltage output port 6 inputs the real-time voltage oscillation signal to the oscilloscope for display. A ground wire 7 is connected to the voltage output port 6. One end of the coupling structure impedance 5 is connected to the metal sheet 4, and the other end of the coupling structure impedance 5 is connected to the voltage output port.

The above embodiment provides a detailed illustration of the structure of the voltage sensor. When degradation or failures occur in the system, slight system degradation can be detected by the voltage sensor designed in this embodiment, greatly enhancing the accuracy of failure detection. The voltage sensor does not need to be connected in the circuit, and there is no need to change the original circuit of the system, making the detection more accurate. Moreover, the voltage sensor is placed above or below the detection circuit of the system, making it more convenient to use.

Figure 5:
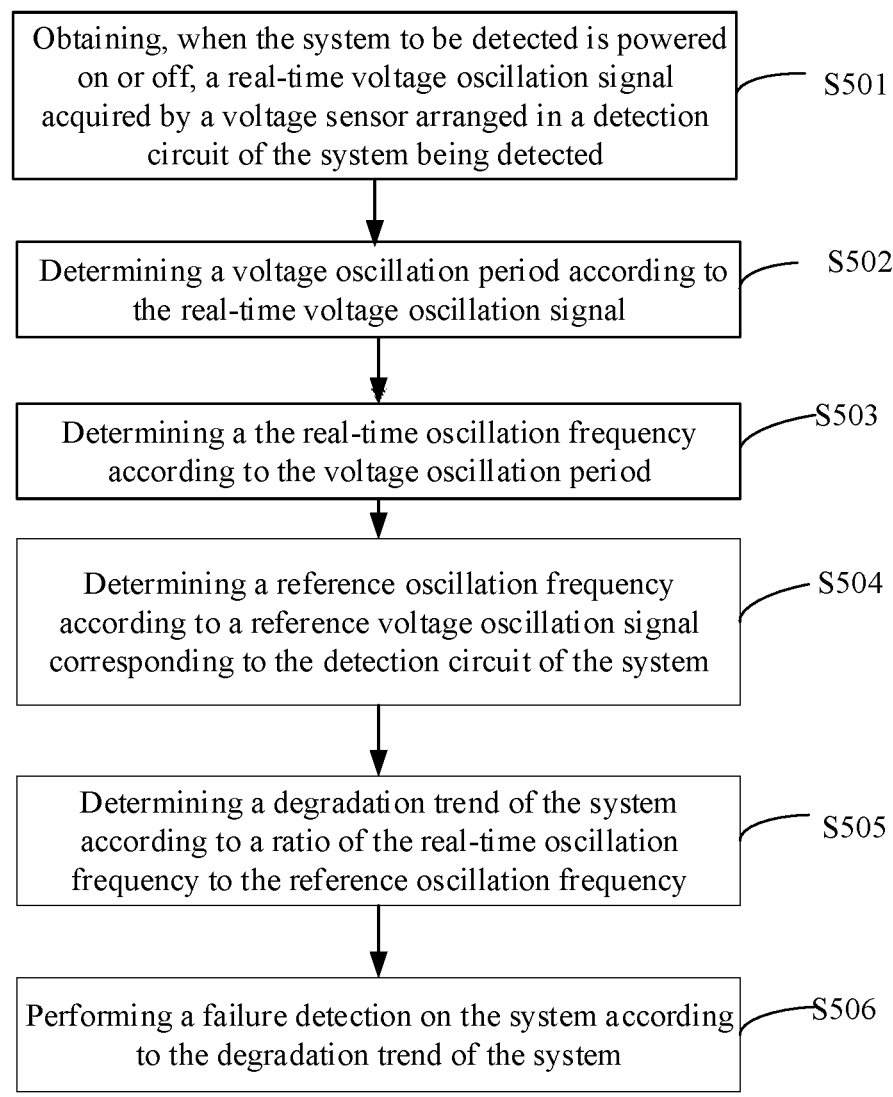
FIG. 5 is a schematic flowchart of a method for detecting system failure according to another embodiment.

In order to illustrate the present solution more comprehensively, the present embodiment provides an optional implementation of a method for detecting system failure, as shown in FIG. 5.

In step S501, a real-time voltage oscillation signal acquired by a voltage sensor arranged in a detection circuit of a system to be detected is obtained when the system is powered on or off.

The detection circuit is the circuit where the source and drain of a switching device in the system are located.

In step S502, a voltage oscillation period is determined according to the real-time voltage oscillation signal.

In step S503, a real-time oscillation frequency is determined according to the voltage oscillation period.

In step S504, a reference oscillation frequency is determined according to a reference voltage oscillation signal corresponding to the detection circuit of the system.

In step S505, a degradation trend of the system is determined according to a ratio of the real-time oscillation frequency to the reference oscillation frequency.

In step S506, a failure detection on the system is performed according to the degradation trend of the system.

Figure 6:
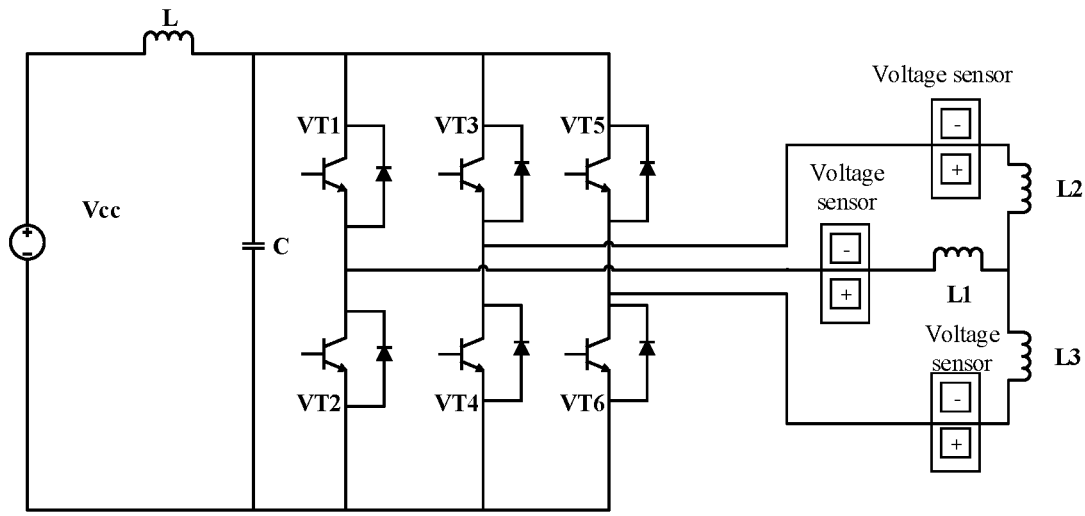
FIG. 6 illustrates a principle of failure detection for a DC-to-AC inverter according to an embodiment.

In some embodiments, the system may be a DC-to-AC inverter and/or a DC-to-DC power supply circuit. As shown in FIG. 6, the principle of detecting a failure in a DC-to-AC inverter is provided. The system includes three detection circuits, each of which includes a source and a drain. A voltage sensor is arranged in each detection circuit, so that the real-time voltage oscillation signals of the three detection circuits of the system can be obtained, and the degradation trend of the system can be determined to predict the failure of the system.

Figure 7:
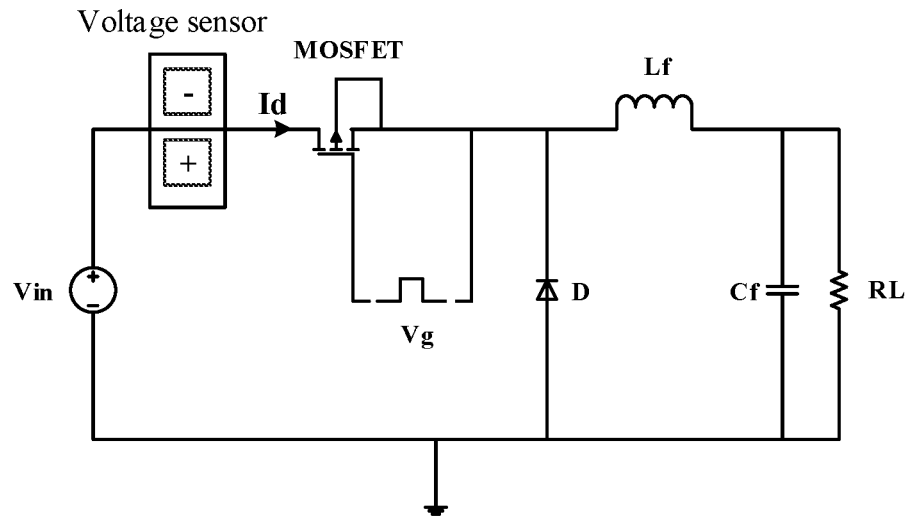
FIG. 7 illustrates a principle of failure detection for a DC-to-DC power supply circuit according to another embodiment.

As shown in FIG. 7, the principle of detecting a failure in a DC-to-DC power supply circuit is provided. The system to be detected includes a detection circuit with a source and a drain. A voltage sensor is arranged in the detection circuit to obtain the real-time voltage oscillation signal of the detection circuit of the system, such that the degradation trend of the system can be determined to predict the failure of the system.

The specific process of the above steps S501-S506 can be referred to the description of the above method embodiments. The implementation principle and technical effects are similar and will not be repeated herein.

It should be understood that, although the steps in the flowcharts involved in the above embodiments are sequentially shown by the indications of the arrows, these steps are not necessarily executed in the order indicated by the arrows. Unless explicitly stated herein, the execution of these steps is not strictly limited to the order, and the steps may be executed in other orders. Moreover, at least a part of the steps in the flowcharts involved in the above embodiments may include multiple steps or multiple stages, and these steps or stages are not necessarily executed and completed at the same time, but may be performed at different times. The execution order of these steps or stages is not necessarily sequential, but may be performed alternately or in turn with other steps or at least a part of the steps or stages of the other steps.

Based on the same inventive concept, the embodiments of the present disclosure also provide a device for detecting system failure for implementing the above-mentioned method for detecting system failure. The solution for solving the problem provided by this device is similar to the solution described in the above method, so that specific limitations in one or more embodiments of the device for detecting system failure provided below can be referred to the foregoing definition of the method for detecting system failure, which will not be repeated herein.

Figure 8:
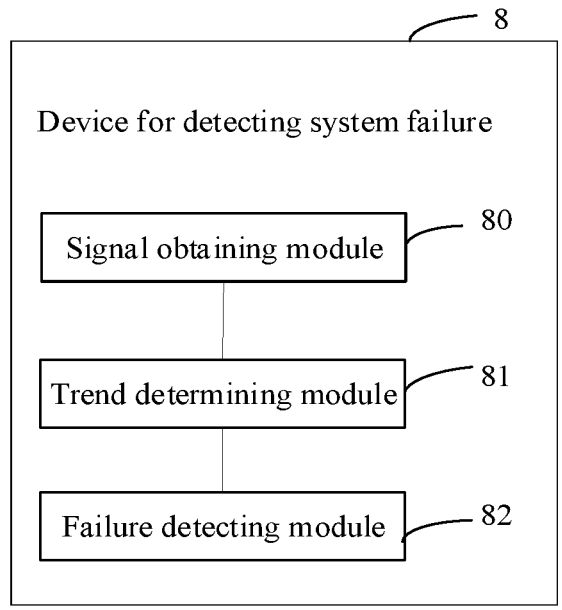
FIG. 8 is a block diagram showing a structure of a device for detecting system failure according to an embodiment.

In an embodiment, as shown in FIG. 8, a device 8 for detecting system failure is provided. The device includes a signal obtaining module 80, a trend determining module 81, and a failure detecting module 82.

The signal obtaining module 80 is configured to obtain a real-time voltage oscillation signal acquired by a voltage sensor arranged in a detection circuit of a system to be detected when the system is powered on or off. The detection circuit is the circuit where the source and drain of a switching device in the system are located.

The trend determining module 81 is configured to determine a degradation trend of the system according to the real-time voltage oscillation signal and a reference voltage oscillation signal corresponding to the detection circuit of the system.

The failure detecting module 82 is configured to perform a failure detection on the system according to the degradation trend of the system.

Figure 9:
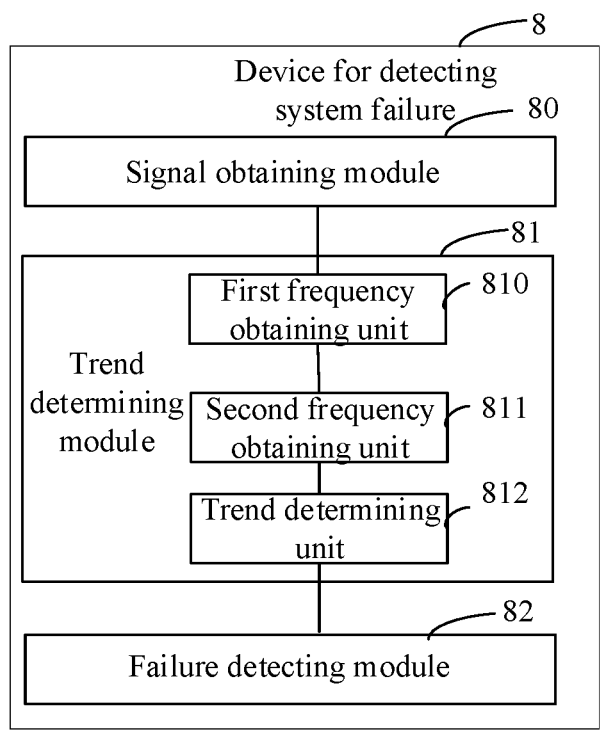
FIG. 9 is a block diagram showing a structure of a device for detecting system failure according to another embodiment.

In another embodiment, as shown in FIG. 9, the trend determining module 81 in FIG. 8 also includes a first frequency obtaining unit 810, a second frequency obtaining unit 811, and a trend determining unit 812.

The first frequency obtaining unit 810 is configured to determine a real-time oscillation frequency according to the real-time voltage oscillation signal.

The second frequency obtaining unit 811 is configured to determine a reference oscillation frequency according to the reference voltage oscillation signal corresponding to the detection circuit of the system.

The trend determining unit 812 is configured to determine the degradation trend of the system according to the real-time oscillation frequency and the reference oscillation frequency.

In another embodiment, the first frequency obtaining unit 810 in FIG. 9 is specifically configured to determine a voltage oscillation period according to the real-time voltage oscillation signal, and determine the real-time oscillation frequency according to the voltage oscillation period.

In another embodiment, the trend determining unit 812 in FIG. 9 is specifically configured to determine the degradation trend of the system according to a ratio of the real-time oscillation frequency to the reference oscillation frequency.

In another embodiment, the voltage sensor has a capacitive coupling structure. The voltage sensor includes an upper insulating plate, a lower insulating plate, a coupling structure impedance, and a voltage output port. The upper insulating plate is configured for the placement of an energized wire of the detection circuit. The lower insulating plate is configured for the placement of a metal sheet that senses the real-time voltage oscillation signal of the energized wire. One end of the coupling structure impedance is connected to the metal sheet, and the other end of the coupling structure impedance is connected to the voltage output port. The real-time voltage oscillation signal sensed by the metal sheet is transmitted to the voltage output port through the coupling structure impedance.

In an embodiment, the system includes a DC-to-AC inverter and/or a DC-to-DC power supply circuit.

The modules of the above device for detecting system failure may be implemented in whole or in part by software, hardware, and combinations thereof. Each of the above modules may be embedded in or independent of a processor in a computer device in a form of hardware, or may be stored in a memory of the computer device in a form of software, so as to be called by the processor to perform the operations corresponding to the above modules.

Figure 10:
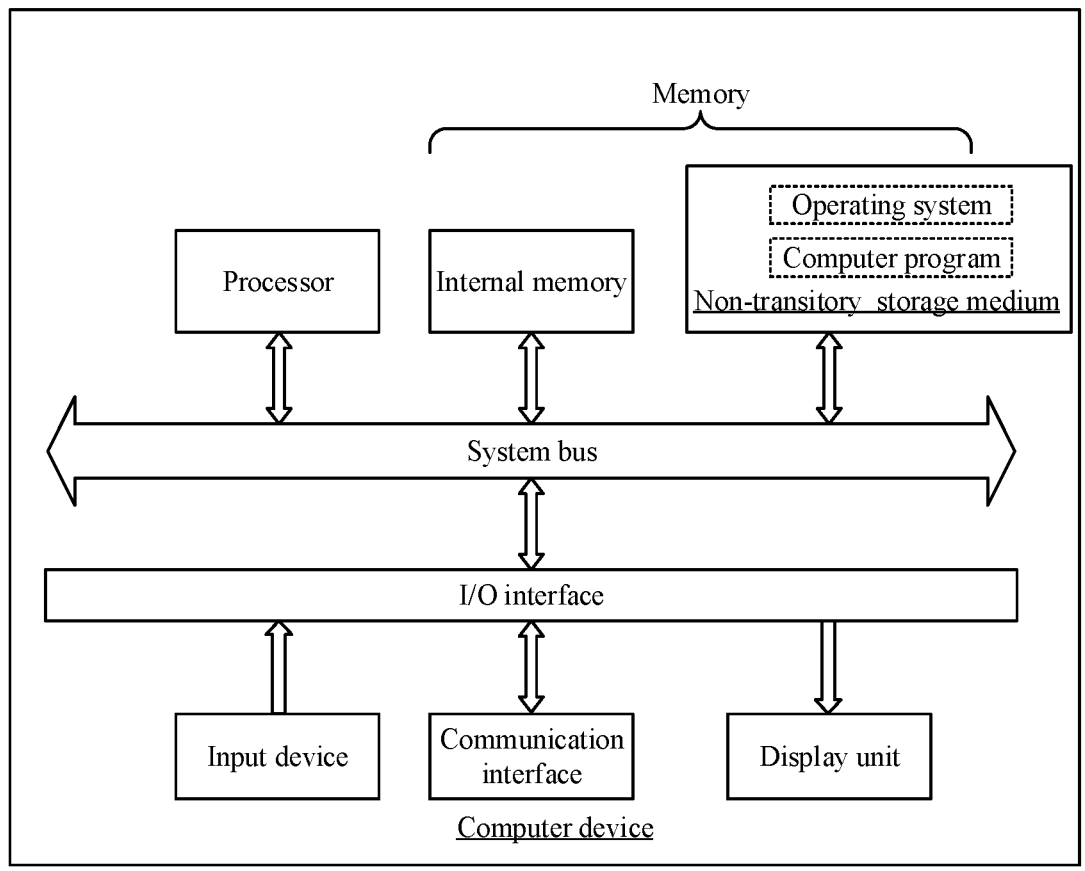
FIG. 10 is a diagram showing an internal structure of a computer device according to an embodiment.

In an embodiment, a computer device is provided. The computer device may be a terminal, the internal structure of which is shown in FIG. 10. The computer device includes a processor, a memory, an input/output interface, a communication interface, a display unit, and an input device. The processor, the memory and the input/output interface are connected through a system bus. The communication interface, the display unit, and the input device are connected to the system bus through the input/output interface. The processor of the computer device is configured to provide computing and control capabilities. The memory of the computer device includes a non-transitory storage medium and an internal memory. The non-transitory storage medium stores the operating system and computer programs. The internal memory provides an environment for running the operating system and the computer programs in the non-transitory storage medium. The input/output interface of the computer device is configured to exchange information between the processor and external devices. The communication interface of the computer device is configured to be in wired or wireless communication with external terminals. The wireless communication can be realized by Wireless Fidelity (Wi-Fi), mobile cellular network, Near Field Communication (NFC) or other technologies. The computer program implements a method for detecting system failure when executed by the processor. The display unit of the computer device is configured to form a visually visible picture. The display unit may be a display screen, a projection device, or a virtual reality imaging device. The display screen may be a liquid crystal display screen or an electronic ink display. The input device of the computer device may be a touch layer covered on the display screen, or it may be a key, a trackball, or a touchpad disposed on the housing of the computer device, or may also be an external keyboard, a touchpad or mouse, etc.

Those skilled in the art should understand that the structure shown in FIG. 10 is merely a block diagram of a part of the structure associated with the solution of the present disclosure, and does not constitute a limitation on the computer device to which the solution of the present disclosure is applied. A specific computer device may include more or less components than shown in the figure, or may combine certain components, or may have different components arrangements.

In an embodiment, a computer device is provided, which includes a memory and a processor. The memory stores a computer program therein. The processor, when executing the computer program, performs the following steps:

obtaining a real-time voltage oscillation signal acquired by a voltage sensor arranged in a detection circuit of a system to be detected when the system is powered on or off, the detection circuit being the circuit where the source and drain of a switching device of the system are located;

determining a degradation trend of the system according to the real-time voltage oscillation signal and a reference voltage oscillation signal corresponding to the detection circuit of the system; and performing a failure detection on the system according to the degradation trend of the system.

In an embodiment, the processor, when executing the computer program, also performs the following steps:
- determining a real-time oscillation frequency according to the real-time voltage oscillation signal;
- determining a reference oscillation frequency according to the reference voltage oscillation signal corresponding to the detection circuit of the system; and
- determining the degradation trend of the system according to the real-time oscillation frequency and the reference oscillation frequency.

In an embodiment, the processor, when executing the computer program, also performs the following steps:
- determining a voltage oscillation period according to the real-time voltage oscillation signal; and
- determining the real-time oscillation frequency according to the voltage oscillation period.

In an embodiment, the processor, when executing the computer program, also performs the following steps:
- determining the degradation trend of the system according to a ratio of the real-time oscillation frequency to the reference oscillation frequency.

In an embodiment, the voltage sensor has a capacitive coupling structure. the voltage sensor includes an upper insulating plate, a lower insulating plate, a coupling structure impedance, and a voltage output port. The upper insulating plate is configured for the placement of an energized wire of the detection circuit. The lower insulating plate is configured for the placement of a metal sheet that senses the real-time voltage oscillation signal of the energized wire. One end of the coupling structure impedance is connected to the metal sheet, and the other end of the coupling structure impedance is connected to the voltage output port. The real-time voltage oscillation signal sensed by the metal sheet is transmitted to the voltage output port through the coupling structure impedance.

In an embodiment, the system includes a DC-to-AC inverter and/or a DC-to-DC power circuit.

In an embodiment, a non-transitory computer-readable storage medium is provided on which a computer program is stored. The computer program, when executed by a processor, implements the following steps:
- obtaining a real-time voltage oscillation signal acquired by a voltage sensor arranged in a detection circuit of a system to be detected when the system is powered on or off, the detection circuit being the circuit where the source and drain of a switching device of the system are located;
- determining a degradation trend of the system according to the real-time voltage oscillation signal and a reference voltage oscillation signal corresponding to the detection circuit of the system; and
- performing a failure detection on the system according to the degradation trend of the system.

In an embodiment, the computer program, when executed by the processor, also implements the following steps:
- determining a real-time oscillation frequency according to the real-time voltage oscillation signal;
- determining a reference oscillation frequency according to the reference voltage oscillation signal corresponding to the detection circuit of the system; and
- determining the degradation trend of the system according to the real-time oscillation frequency and the reference oscillation frequency.

In an embodiment, the computer program, when executed by the processor, also implements the following steps:
- determining a voltage oscillation period according to the real-time voltage oscillation signal; and
- determining the real-time oscillation frequency according to the voltage oscillation period.

In an embodiment, the computer program, when executed by the processor, also implements the following steps:
- determining the degradation trend of the system according to a ratio of the real-time oscillation frequency to the reference oscillation frequency.

In an embodiment, the voltage sensor is a voltage sensor with a capacitive coupling structure. The voltage sensor includes an upper insulating plate, a lower insulating plate, a coupling structure impedance, and a voltage output port. The upper insulating plate is configured for the placement of an energized wire of the detection circuit. The lower insulating plate is configured for the placement of a metal sheet that senses the real-time voltage oscillation signal of the energized wire. One end of the coupling structure impedance is connected to the metal sheet, and the other end of the coupling structure impedance is connected to the voltage output port. The real-time voltage oscillation signal sensed by the metal sheet is transmitted to the voltage output port through the coupling structure impedance.

In an embodiment, the system includes a DC-to-AC inverter and/or a DC-to-DC power circuit.

In an embodiment, a computer program product is provided, which includes a computer program that, when executed by a processor, implements the following steps:
- obtaining a real-time voltage oscillation signal acquired by a voltage sensor arranged in a detection circuit of a system to be detected when the system is powered on or off, the detection circuit being the circuit where the source and drain of a switching device of the system are located;
- determining a degradation trend of the system according to the real-time voltage oscillation signal and a reference voltage oscillation signal corresponding to the detection circuit of the system; and
- performing a failure detection on the system according to the degradation trend of the system.

In an embodiment, the computer program, when executed by the processor, also implements the following steps:
- determining a real-time oscillation frequency according to the real-time voltage oscillation signal;
- determining a reference oscillation frequency according to the reference voltage oscillation signal corresponding to the detection circuit of the system; and
- determining the degradation trend of the system according to the real-time oscillation frequency and the reference oscillation frequency.

In an embodiment, the computer program, when executed by the processor, also implements the following steps:
- determining a voltage oscillation period according to the real-time voltage oscillation signal; and
- determining the real-time oscillation frequency according to the voltage oscillation period.

In an embodiment, the computer program, when executed by the processor, also implements the following steps:
- determining the degradation trend of the system according to a ratio of the real-time oscillation frequency to the reference oscillation frequency.

In an embodiment, the voltage sensor is a voltage sensor with a capacitive coupling structure, and the voltage sensor includes an upper insulating plate, a lower insulating plate, a coupling structure impedance, and a voltage output port.

The upper insulating plate is configured for the placement of an energized wire of the detection circuit. The lower insulating plate is configured for the placement of a metal sheet that senses the real-time voltage oscillation signal of the energized wire. One end of the coupling structure impedance is connected to the metal sheet, and the other end of the coupling structure impedance is connected to the voltage output port. The real-time voltage oscillation signal sensed by the metal sheet is transmitted to the voltage output port through the coupling structure impedance.

In an embodiment, the system includes a DC-to-AC inverter and/or a DC-to-DC power circuit.

Those skilled in the art can understand that all or part of the processes of the methods of the above embodiments can be implemented by instructing relevant hardware through a computer program. The computer program can be stored in a non-transitory computer-readable storage medium, and when executed, perform the processes of the methods in the aforementioned embodiments. Any reference to a memory, a database or other medium used in the embodiments provided in the present disclosure may include at least one of non-transitory memory and transitory memory. The non-transitory memory may include a Read-Only Memory (ROM), a magnetic tape, a floppy disk, a flash memory, an optical memory, a high-density embedded non-transitory memory, a resistive random access memory (ReRAM), a Magnetoresistive Random Access Memory (MRAM), a Ferroelectric Random Access Memory (FRAM), a Phase Change Memory (PCM), or a graphene memory, etc. The transitory memory may include a Random Access Memory (RAM), an external cache memory, or the like. For illustration rather than limitation, the RAM may be in various forms, such as a Static Random Access Memory (SRAM) or a Dynamic Random Access Memory (DRAM). The database involved in the embodiments provided in the present disclosure may include at least one of a relational database or a non-relational database. The non-relational database may include a blockchain-based distributed database, etc., but is not limited thereto. The processors involved in the embodiments provided in present disclosure may be general-purpose processors, central processing units, graphics processors, digital signal processors, programmable logic devices, data processing logic devices based on quantum computing, etc., and is not limited to this.

The technical features in the foregoing embodiments may be randomly combined. For concise description, not all possible combinations of the technical features in the embodiments are described. However, provided that combinations of the technical features do not conflict with each other, the combinations of the technical features are considered as falling within the scope recorded in this specification.

The above-mentioned embodiments only illustrate several embodiments of the present disclosure, and the descriptions of which are relatively specific and detailed, but should not be construed as limitations to the scope of the present disclosure. It should be noted that, for those skilled in the art, variations and improvements can be made without departing from the concept of the present disclosure, which all belong to the protection scope of the present disclosure. Therefore, the protection scope of the present disclosure shall be subject to the appended claims.

What is claimed is:

1. A method for detecting system failure, comprising:
   obtaining, when a system to be detected is powered on or off, a real-time voltage oscillation signal acquired by a voltage sensor arranged in a detection circuit of the system, wherein the detection circuit is a circuit where a source and drain of a switching device of the system are located;
   determining a degradation trend of the system according to the real-time voltage oscillation signal and a reference voltage oscillation signal corresponding to the detection circuit of the system; and
   performing a failure detection on the system according to the degradation trend of the system.

2. The method according to claim 1, wherein the determining the degradation trend of the system according to the real-time voltage oscillation signal and the reference voltage oscillation signal corresponding to the detection circuit of the system comprises:
   determining a real-time oscillation frequency according to the real-time voltage oscillation signal;
   determining a reference oscillation frequency according to the reference voltage oscillation signal corresponding to the detection circuit of the system; and
   determining the degradation trend of the system according to the real-time oscillation frequency and the reference oscillation frequency.

3. The method according to claim 2, wherein the determining the real-time oscillation frequency according to the real-time voltage oscillation signal comprises:
   determining a voltage oscillation period according to the real-time voltage oscillation signal; and
   determining the real-time oscillation frequency according to the voltage oscillation period.

4. The method according to claim 2, wherein the determining the degradation trend of the system according to the real-time oscillation frequency and the reference oscillation frequency comprises:
   determining the degradation trend of the system according to a ratio of the real-time oscillation frequency to the reference oscillation frequency.

5. The method according to claim 1, the voltage sensor comprises a capacitive coupling structure.

6. The method according to claim 5, wherein the voltage sensor comprises an upper insulating plate, a lower insulating plate, a coupling structure impedance, and a voltage output port, the upper insulating plate is configured for a placement of an energized wire of the detection circuit, the lower insulating plate is configured for a placement of a metal sheet that senses the real-time voltage oscillation signal of the energized wire, one end of the coupling structure impedance is connected to the metal sheet, the other end of the coupling structure impedance is connected to the voltage output port, and the real-time voltage oscillation signal sensed by the metal sheet is transmitted to the voltage output port through the coupling structure impedance.

7. The method according to claim 1, wherein the system comprises at least one of a DC-to-AC inverter or a DC-to-DC power supply circuit.

8. The method according to claim 1, wherein a relationship mapping table is created based on a relationship between various voltage oscillation signals, the reference voltage oscillation signal, and the degradation trend of the system, and the degradation trend of the system is determined by looking up the relationship mapping table.

9. The method according to claim 1, wherein a fault threshold is pre-set, and it is determined that a failure is about to occur in the system when it is detected that the degradation degree of the system is about to exceed the fault threshold.

10. A non-transitory computer-readable storage medium with a computer program stored therein, wherein the computer program, when executed by a processor, causes the processor to perform steps of the method according to claim 1.

11. A computer program product comprising a computer program, wherein the computer program, when executed by a processor, causes the processor to perform steps of the method according to claim 1.

12. A device for detecting system failure, comprising:
a signal obtaining module configured to obtain, when a system to be detected is powered on or off, a real-time voltage oscillation signal acquired by a voltage sensor arranged in a detection circuit of the system, the detection circuit being a circuit where a source and drain of a switching device in the system are located;
a trend determining module configured to determine a degradation trend of the system according to the real-time voltage oscillation signal and a reference voltage oscillation signal corresponding to the detection circuit of the system; and
a failure detecting module configured to perform a failure detection on the system according to the degradation trend of the system.

13. A computer device comprising a memory and a processor, the memory storing a computer program, wherein the processor, when executing the computer program, is configured to perform a method for detecting system failure, the method comprising:
obtaining, when a system is powered on or off, a real-time voltage oscillation signal acquired by a voltage sensor arranged in a detection circuit of the system, wherein the detection circuit is a circuit where a source and drain of a switching device of the system are located;
determining a degradation trend of the system according to the real-time voltage oscillation signal and a reference voltage oscillation signal corresponding to the detection circuit of the system; and
performing a failure detection on the system according to the degradation trend of the system.

14. The computer device according to claim 13, wherein the determining the degradation trend of the system according to the real-time voltage oscillation signal and the reference voltage oscillation signal corresponding to the detection circuit of the system comprises:
determining a real-time oscillation frequency according to the real-time voltage oscillation signal;
determining a reference oscillation frequency according to the reference voltage oscillation signal corresponding to the detection circuit of the system; and
determining the degradation trend of the system according to the real-time oscillation frequency and the reference oscillation frequency.

15. The computer device according to claim 14, wherein the determining the real-time oscillation frequency according to the real-time voltage oscillation signal comprises:
determine a voltage oscillation period according to the real-time voltage oscillation signal; and
determining the real-time oscillation frequency according to the voltage oscillation period.

16. The computer device according to claim 14, wherein the determining the degradation trend of the system according to the real-time oscillation frequency and the reference oscillation frequency comprises:
determining the degradation trend of the system according to a ratio of the real-time oscillation frequency to the reference oscillation frequency.

17. The computer device according to claim 13, wherein the voltage sensor is a voltage sensor comprises a capacitive coupling structure.

18. The computer device according to claim 17, wherein the voltage sensor comprises an upper insulating plate, a lower insulating plate, a coupling structure impedance, and a voltage output port, the upper insulating plate is configured for a placement of an energized wire of the detection circuit, the lower insulating plate is configured for a placement of a metal sheet that senses the real-time voltage oscillation signal of the energized wire, one end of the coupling structure impedance is connected to the metal sheet, the other end of the coupling structure impedance is connected to the voltage output port, and the real-time voltage oscillation signal sensed by the metal sheet is transmitted to the voltage output port through the coupling structure impedance.

19. The computer device according to claim 13, wherein the system comprises at least one of a DC-to-AC inverter or a DC-to-DC power supply circuit.

20. The computer device according to claim 13, wherein a fault threshold is pre-set, and it is determined that a failure is about to occur in the system when it is detected that the degradation degree of the system is about to exceed the fault threshold.

* * * * *